(12) United States Patent
Dong et al.

(10) Patent No.: US 12,733,129 B2
(45) Date of Patent: Sep. 8, 2026

(54) METHOD FOR MANUFACTURING HEAT DISSIPATION STRUCTURE OF ELECTRONIC ELEMENT, HEAT DISSIPATION STRUCTURE, AND ELECTRONIC DEVICE

(71) Applicant: Honor Device Co., Ltd., Shenzhen (CN)

(72) Inventors: Hanghang Dong, Shenzhen (CN); Erliang Li, Shenzhen (CN); Junjie Yang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 248 days.

(21) Appl. No.: 18/044,422

(22) PCT Filed: Aug. 29, 2022

(86) PCT No.: PCT/CN2022/115553

§ 371 (c)(1),
(2) Date: Mar. 8, 2023

(87) PCT Pub. No.: WO2023/071493

PCT Pub. Date: May 4, 2023

(65) Prior Publication Data

US 2024/0298424 A1 Sep. 5, 2024

(30) Foreign Application Priority Data

Oct. 26, 2021 (CN) ......................... 202111249062.2

(51) Int. Cl.
*H05K 7/20* (2006.01)

(52) U.S. Cl.
CPC ..... *H05K 7/20263* (2013.01); *H05K 7/20272* (2013.01); *H05K 7/20409* (2013.01)

(58) Field of Classification Search
CPC ........... H05K 7/20263; H05K 7/20272; H05K 7/20409

(Continued)

(56) References Cited

U.S. PATENT DOCUMENTS 4,323,914 A * 4/1982 Berndlmaier ....... H01L 23/3121 257/E23.125
6,665,186 B1 * 12/2003 Calmidi ................ H01L 23/473 361/708

(Continued)

FOREIGN PATENT DOCUMENTS

CN 1971776 A 5/2007
CN 103094227 A 5/2013

(Continued)

*Primary Examiner* — Anatoly Vortman
(74) *Attorney, Agent, or Firm* — Slater Matsil, LLP

(57) ABSTRACT

Disclosed are a method for manufacturing a heat dissipation structure of an electronic element, a heat dissipation structure, and an electronic device. The method includes: covering a periphery of an electronic element with a heat dissipation cover, where the heat dissipation cover is provided with a through hole, and an inner wall of the heat dissipation cover is provided with a plurality of electrodes; injecting a liquid metal through the through hole into an accommodating cavity enclosed by the substrate and the heat dissipation cover until the entire accommodating cavity is filled, and during this period, energizing the electrodes, so that a current flows through the liquid metal to reduce surface tension of the liquid metal; and sealing the through hole.

15 Claims, 7 Drawing Sheets

(58) Field of Classification Search
USPC .......................................................... 361/699
See application file for complete search history.

(56) References Cited

U.S. PATENT DOCUMENTS 6,891,259 B2 * 5/2005 Im ........................... H01L 23/16 257/796
7,220,624 B2 * 5/2007 Neogi ..................... H01L 21/50 438/126
7,477,123 B2 1/2009 Beerling
7,755,184 B2 * 7/2010 Macris .................... H01L 23/42 257/E23.101
2003/0085475 A1 * 5/2003 Im ........................... H01L 23/16 257/796
2005/0218508 A1 * 10/2005 Fitzgerald ............... H01L 23/42 257/E23.087
2006/0118925 A1 * 6/2006 Macris .................... H01L 23/26 257/667
2006/0120051 A1 * 6/2006 Macris .................... H01L 24/32 257/E23.137
2006/0227510 A1 * 10/2006 Fitzgerald ............... H01L 24/32 257/E21.503
2006/0260919 A1 11/2006 Aimi et al.
2006/0261467 A1 * 11/2006 Colgan ................. H01L 23/433 257/E23.09
2007/0115084 A1 5/2007 Beerling
2007/0127211 A1 * 6/2007 Macris .................... H01L 23/42 257/E23.09
2008/0137300 A1 * 6/2008 Macris .................. H01L 23/433 257/E23.09
2023/0282545 A1 * 9/2023 Shen ....................... H01L 23/42 257/712

FOREIGN PATENT DOCUMENTS

CN 107205330 A 9/2017
CN 107687992 A 2/2018
CN 110034702 A 7/2019
CN 110234214 A 9/2019
CN 110926245 A 3/2020
CN 211297488 U 8/2020
CN 113453467 A 9/2021

* cited by examiner 150
122
130
121
110
170
140

METHOD FOR MANUFACTURING HEAT DISSIPATION STRUCTURE OF ELECTRONIC ELEMENT, HEAT DISSIPATION STRUCTURE, AND ELECTRONIC DEVICE

CROSS-REFERENCE TO RELATED APPLICATIONS

This application is a national stage of International Application No. PCT/CN2022/115553 filed on Aug. 29, 2022, which claims priority to Chinese Patent Application No. 202111249062.2 filed on Oct. 26, 2021. The disclosures of both of the aforementioned application are hereby incorporated by reference in their entireties.

TECHNICAL FIELD

This application relates to the technical field of electronic devices, and in particular, to a method for manufacturing a heat dissipation structure of an electronic element, a heat dissipation structure, and an electronic device.

BACKGROUND

With the progress of science and technology, people's requirements for electronic devices are becoming increasingly high, such as high performance, high reliability, and ultra-thinness, which makes an integration level of electronic elements in an electronic device increasingly high, and as power consumption increases, the electronic elements generate a lot of heat during operation. To make the electronic device operate normally, it is required to dissipate heat from the electronic elements.

In a related technology, electronic elements may be cooled by a heat dissipation module such as a heat dissipation plate and a cooling fan. Because the electronic elements should not be squeezed by an external force to avoid damage to the electronic elements, certain gaps are usually reserved between the electronic elements and the heat dissipation module to prevent the heat dissipation module from squeezing the electronic elements. The air in the gaps has high thermal resistance and extremely weak thermal conductivity, which hinders conduction of heat to the heat dissipation module. To improve heat conduction efficiency, the gaps may be filled with heat conduction media to make the heat conduction smoother and faster.

A liquid metal has good heat dissipation performance and has heat dissipation efficiency which is about 10 times that of thermally conductive silicone grease. Therefore, many devices having high heat dissipation requirements use the liquid metal to fill the foregoing gaps to conduct heat. However, due to high surface tension of the liquid metal, as shown in FIG. 1, under an action of surface tension, the surface of the liquid metal is not easy to spread evenly, which makes it difficult for the liquid metal to fill the gaps between the electronic elements and the heat dissipation module, and there are still many gaps between the electronic elements and the heat dissipation module, resulting in reduced heat dissipation efficiency.

SUMMARY

This application provides a method for manufacturing a heat dissipation structure of an electronic element, a heat dissipation structure, and an electronic device, to reduce surface tension of a liquid metal, so that the liquid metal can fill a cavity between an electronic element and a heat dissipation cover, thereby increasing efficiency of dissipating heat from the electronic element.

According to a first aspect, this application provides a method for manufacturing a heat dissipation structure of an electronic element, where the method includes the following steps:

covering a periphery of the electronic element with a heat dissipation cover, and hermetically connecting the heat dissipation cover to a substrate on which the electronic element is installed, where the heat dissipation cover is provided with a through hole, and an inner wall of the heat dissipation cover is provided with a plurality of electrodes;

injecting a liquid metal through the through hole in the heat dissipation cover into an accommodating cavity enclosed by the substrate and the heat dissipation cover until the entire accommodating cavity is filled, and during this period of injecting the liquid metal, energizing the foregoing electrodes, so that a current flows through the liquid metal to reduce surface tension of the liquid metal; and sealing the foregoing through hole.

The foregoing heat dissipation cover is configured to dissipate the heat generated by the electronic element to the outside to cool the electronic element. After the heat dissipation cover covers the periphery of the electronic element, a heat dissipation effect can be achieved, the electronic element can be protected, so that the electronic element is prevented from being damaged due to contact and squeezing with another component, thereby improving reliability of operation of the electronic element.

A material of the heat dissipation cover may include at least one of a metal, graphene, silicone grease, silica gel, and plastic, and the material of the heat dissipation cover may also include another material with good heat dissipation performance. This is not specifically limited in this application.

Considering a heat conduction effect and a shielding effect of the heat dissipation cover, the heat dissipation cover may be a metal cover, and a material of the metal cover may be stainless steel, a copper-nickel-zinc alloy, a magnesium-aluminum alloy, or the like. This is not limited in this application.

The heat dissipation cover may be hermetically connected to the substrate by using a sealing structure such as a sealing ring, a sealing tape, a sealing strip, and a sealant.

An end of the heat dissipation cover is provided with an opening, and the heat dissipation cover covers the periphery of the electronic element through the opening. The through hole in the heat dissipation cover may be provided in a top wall of the heat dissipation cover or in a side wall of the heat dissipation cover. The top wall of the heat dissipation cover is opposite to the substrate, and the side wall of the heat dissipation cover is connected to the substrate. The through hole may be a hole of any shape, such as a circular hole, a square hole, or an elongated hole.

During filling with the liquid metal, the substrate is usually placed on a supporting surface such as a desktop for filling. To make the accommodating cavity filled with the liquid metal more easily, a through hole may be provided in the top wall of the heat dissipation cover, so that the liquid metal flows into the accommodating cavity from top to bottom, making the filling easier.

An electrode is a component in an electronic device, and is used as two terminals for inputting or outputting a current in a conducting medium (solid, gas, vacuum, or liquid). One pole for inputting a current is referred to as an anode, and the anode loses electrons; and the other pole for emitting a current is referred to as a cathode, and the cathode gains electrons.

Two, three, four or more electrodes may be arranged in the heat dissipation cover. Structural shapes of the electrodes may be the same or different. For example, a plurality of electrodes may include at least one of a cylindrical electrode, a plate electrode, an elongated electrode, and a point electrode, but are not limited thereto. The point electrode may be understood as a spherical electrode with a small diameter, or a columnar electrode with a small diameter and height, or another shape with a small cross-sectional area.

In this embodiment of this application, the electrode is made of a conductive metal material. For example, the material of the electrode may be at least one of copper, iron, silver, tin, and titanium, but is not limited thereto.

In this embodiment of this application, the electrodes may be used in pairs, a pair of electrodes includes an anode electrode and a cathode electrode, and a current flows from the anode to the cathode. During energization, two electrodes in a pair of electrodes are connected to a positive electrode and a negative electrode of a power supply respectively, so that one of the two electrodes is the anode and the other is the cathode. Potentials of two electrodes in a pair of electrodes are not equal, thereby forming a potential difference between the two electrodes.

The two electrodes of a pair of electrodes may have the same shape or different shapes.

In this embodiment of this application, when electrodes are energized, potentials of at least two electrodes are not equal, thereby forming a potential difference between the two electrodes, to form a current between the two electrodes.

When two electrodes are provided in the heat dissipation cover, the two electrodes are a pair of electrodes. During energization, one electrode may be connected to a positive electrode of a power supply, and the other electrode is connected to a negative electrode of the power supply. Potentials of the two electrodes are different, thereby forming a potential difference between the two electrodes, which is a voltage. The electrode connected to the positive electrode of the power supply is the anode, and the electrode connected to the negative electrode of the power supply is the cathode.

During energization, for each pair of electrodes, the positive electrode and the negative electrode of the power supply may be connected to the two electrodes in the pair of electrodes, so that a potential difference is formed between the two electrodes in the pair of electrodes.

Because a distance between two adjacent electrodes is relatively small, a current between two adjacent electrodes is higher, so that the surface tension of the liquid metal can be reduced more easily. Therefore, in this embodiment of this application, every two adjacent electrodes may be energized as a pair of electrodes.

In this embodiment of this application, a principle in which after electrodes are energized, a current flows through the liquid metal to reduce surface tension of the liquid metal is as follows: When the electrodes are energized, the current can be formed in the liquid metal, a large quantity of electrons flow inside the liquid metal, the moving electrons can provide energy for oxygen in the air to be changed into oxygen ions, so that the oxygen in the air reacts with the liquid metal more easily to form a flowing oxide layer on the surface of the liquid metal, and the oxide layer is formed by a metal oxide, which is usually solid powder, and has a very small surface tension coefficient that is about 0.1 mN/m, so that the oxide layer formed on the surface of the liquid metal can greatly reduce the surface tension of the liquid metal.

In the method for manufacturing a heat dissipation structure of an electronic element according to this embodiment of this application, because the inner wall of the heat dissipation cover is provided with a plurality of electrodes, in the process of injecting the liquid metal into the accommodating cavity enclosed by the substrate and the heat dissipation cover, energizing the electrodes can make the current flow through the liquid metal, so that oxygen in the air reacts with the liquid metal more easily to form a flowing oxide layer on the surface of the liquid metal. The oxide layer is formed by a metal oxide, which is usually solid powder, and has very small surface tension. Therefore, the oxide layer formed on the surface of the liquid metal can greatly reduce the surface tension of the liquid metal, so that the surface of the liquid metal can be evenly spread, and the liquid metal can fill the cavity between the electronic element and the heat dissipation cover, thereby preventing gaps between the electronic element and the heat dissipation cover and increasing heat dissipation efficiency.

In addition, the method according to this embodiment of this application can reduce tension of each surface of the liquid metal, including a top surface, a bottom surface, and a side surface, so that wettability of the liquid metal on an outer surface of the electronic element, an inner surface of the heat dissipation cover, and a surface of the substrate can be improved, and the cavity between the electronic element and the heat dissipation cover is further filled, thereby increasing the heat dissipation efficiency.

The heat dissipation cover is connected to the substrate and encloses the outside of the electronic element. The heat dissipation cover has a heat dissipation effect, and also has an effect of protecting the electronic element, thereby better protecting the electronic element.

In an optional design, a potential difference between any pair of adjacent electrodes among the plurality of foregoing electrodes is 0.5 V~2 V.

For example, the potential difference may be 0.5 V, 1 V, 1.5 V, 2 V, or the like, but is not limited thereto.

In this embodiment, the potential difference between a pair of adjacent electrodes is set to a small voltage, so that an oxide layer can be formed on the surface of the liquid metal to reduce the surface tension, and the following case is prevented: The oxide layer is excessively thick, which destroys fluidity of the liquid metal and reduces heat dissipation performance of the liquid metal.

In an optional design, the heat dissipation cover includes a heat dissipation module and an enclosure, and the foregoing electrodes are arranged on an inner wall of the heat dissipation module.

Specifically, the enclosure may have an annular structure, and the enclosure encloses by one round and is fastened to an edge of the heat dissipation module, and the enclosure extends to a side of the heat dissipation module, so as to form the heat dissipation cover with the heat dissipation module.

The heat dissipation module may be fastened to the enclosure in a connection mode such as bonding, clamping, threaded connection, riveting, and welding. To improve structural reliability of the heat dissipation cover, the heat dissipation module and the enclosure can form an integrated structure by using an integrated molding process, thereby making a processing flow simpler.

The heat dissipation module may include a heat dissipation plate, and the heat dissipation plate may be provided with a heat dissipation structure such as a heat dissipation grid and cooling fins, so that a larger heat exchange area can be provided, thereby increasing the heat dissipation efficiency of the heat dissipation structure. The heat dissipation module may also be a metal support of a functional element in the electronic device. For example, when the electronic device is a mobile phone, the heat dissipation module is a metal supporting component of a battery or a screen, which can quickly conduct heat from the inside of the mobile phone to the outside and dissipate the heat to the environment.

During filling with the liquid metal, the substrate is usually placed on a manufactured surface such as a desktop for filling, the heat dissipation module is located at the top, and a liquid level of the liquid metal in the accommodating cavity gradually rises from a position close to the substrate to a position close to the heat dissipation module. In this embodiment of this application, the electrodes are installed on the inner wall of the heat dissipation module, so that when the accommodating cavity is almost filled with the liquid metal, the liquid metal comes into contact with the electrodes to form a current, and then an oxide layer is formed on the surface. In this way, the accommodating cavity can be filled with the liquid metal, and the thickness of the oxide layer of the liquid metal can be reduced, thereby having little impact on fluidity and heat dissipation of the liquid metal.

In an optional design, two through holes are provided in the heat dissipation cover, and the two through holes are provided in the heat dissipation module.

The two through holes are used to inject the liquid metal and discharge gas in the accommodating cavity, respectively.

During filling with the liquid metal, the liquid level of the liquid metal in the accommodating cavity gradually rises from the position close to the substrate to the position close to the heat dissipation module. In this implementation, the through holes are provided in the heat dissipation module, that is, the through holes are provided in the top wall of the heat dissipation cover. In this way, as described above in the method embodiment, when the through holes are used to inject the liquid metal, the liquid metal can flow into the accommodating cavity from top to bottom, so that accommodating cavity can be filled with the liquid metal more easily. When the through holes are used for exhaust, because the through holes are located at the top of the accommodating cavity, all the gas in the accommodating cavity can be exhausted through the through holes, so that the liquid metal can be more smoothly injected into the accommodating cavity.

In an optional design, the plurality of foregoing electrodes include at least one point electrode and at least one strip electrode.

Specifically, the plurality of electrodes may include one point electrode and one strip electrode; or may include one point electrode and a plurality of strip electrodes, where each strip electrode forms a pair of electrodes with one point electrode during energization; or may include a plurality of point electrodes and a plurality of strip electrodes, where each point electrode and each strip electrode adjacent to each other form a pair of electrodes during energization.

The shape of the strip electrode may be a linear shape, an arc shape, a wave shape, or the like, but is not limited thereto.

During energization, a point electrode and a strip electrode may be used as a pair of electrodes, and are an anode and a cathode respectively. Specifically, the point electrode may be the cathode, and the strip electrode is the anode; or the point electrode may be the anode, and the strip electrode is the cathode. In this way, a divergent current may be formed between the point electrode and the strip electrode, and the current has a wide coverage, so that the current can be quickly formed in the surface of the liquid metal in a large area. The current can flow to all positions of the surface of the liquid metal, so that the current can flow through the entire surface of the liquid metal, and therefore the surface tension of the liquid metal can be reduced more easily and quickly.

In an optional design, the plurality of foregoing electrodes are arranged on the inner wall of the heat dissipation module in an array mode.

In this implementation, three or more electrodes may be provided. A plurality of electrodes may be arranged on the inner wall of the heat dissipation module in the form of a linear array, a circular array, a rectangular array, or the like.

For example, when a plurality of electrodes are distributed in a rectangular array, all rows of electrodes may be alternately used as anodes and cathodes. For example, the first row and the third row are anodes, and the second row and the fourth row are cathodes. The electrodes may alternatively be energized in another mode, which is not limited herein.

Optionally, the plurality of electrodes may all be point electrodes, and the electrodes are distributed in a circular array or a rectangular array.

In this implementation, an array distribution mode of the electrodes may be determined based on the shape of the inner wall of the heat dissipation module. For example, when the inner wall of the heat dissipation module is circular, the electrodes are distributed in a circular array; or when the inner wall of the heat dissipation module is rectangular, the electrodes are distributed in a rectangular array. In this way, when the electrodes are energized, the current flows through the entire surface of the liquid metal more quickly, so that the surface tension of the liquid metal can be reduced more easily and quickly.

In addition, a plurality of electrodes distributed in an array can further increase a surface area of the heat dissipation module, a contact area between the heat dissipation module and the liquid metal, and a contact area for heat exchange with air, thereby increasing heat dissipation efficiency.

In an optional design, the plurality of foregoing electrodes all have annular structures with different sizes, and the plurality of electrodes with the annular structures are sequentially nested.

In this embodiment, diameters of the plurality of electrodes sequentially become larger, so that the electrodes are sequentially nested. During energization, every two adjacent electrodes may form a pair of electrodes.

In this implementation, because every two adjacent rings among sequentially nested rings can be energized to form a pair of electrodes, and the rings each have a closed structure, the surface of the liquid metal can form a current more quickly and evenly, the surface tension of the liquid metal can be reduced more easily and quickly.

In an optional design, the step of sealing the foregoing through hole may be implemented in the following mode:

sealing the through hole by using a heat conducting material.

By sealing the through hole by using the heat conducting material, heat dissipation performance of the heat dissipation cover can be better, so that the heat dissipation performance of the heat dissipation structure is better.

According to a second aspect, an embodiment of this application further provides a heat dissipation structure of an electronic element, including:

a substrate provided with an electronic element;

a heat dissipation cover hermetically connected to the foregoing substrate and covering a periphery of the electronic element, where the heat dissipation cover and the foregoing substrate form an accommodating cavity for accommodating the electronic element, an inner wall of the heat dissipation cover is provided with a plurality of electrodes, and the heat dissipation cover is provided with a sealed through hole; and a liquid metal filling the foregoing accommodating cavity.

In an optional design, the heat dissipation cover includes a heat dissipation module and an enclosure, and the foregoing electrodes are arranged on an inner wall of the heat dissipation module.

In an optional design, two through holes are provided in the heat dissipation cover, and the two through holes are provided in the heat dissipation module.

In an optional design, the plurality of foregoing electrodes include at least one point electrode and at least one strip electrode.

In an optional design, the plurality of foregoing electrodes are arranged on the inner wall of the heat dissipation module in an array mode.

In an optional design, the plurality of foregoing electrodes all have annular structures with different sizes, and the plurality of electrodes with the annular structures are sequentially nested.

In an optional design, a material for sealing the foregoing through hole is a heat conducting material.

Because the heat dissipation structure of an electronic element according to this embodiment of this application is manufactured by using the foregoing manufacturing method, the heat dissipation structure has the same beneficial effects as the heat dissipation structure of an electronic element manufactured by using the foregoing manufacturing method. Details are not described herein again.

According to a third aspect, this application further provides an electronic device, including the heat dissipation structure of an electronic element according to any one of the implementations of the second aspect.

The electronic device according to this embodiment of this application includes the foregoing heat dissipation structure of an electronic element, and therefore has the same beneficial effects as the foregoing heat dissipation structure of an electronic element. Details are not described herein again.

REFERENCE NUMERALS

Figure 1:
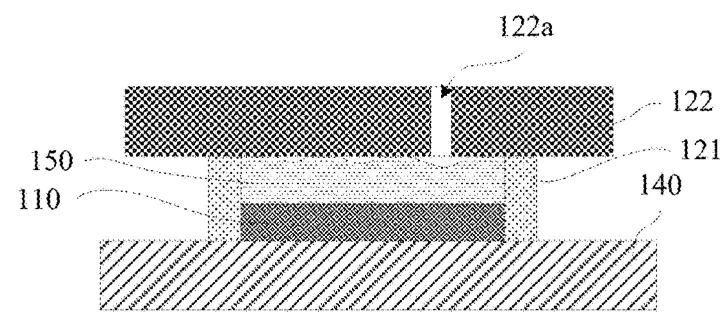
FIG. 1 is a schematic diagram of a state of a liquid metal in a heat dissipation cover in a related technology.

1000. Electronic device;

100. Heat dissipation structure of an electronic element;

110. Electronic element; 120. Heat dissipation cover; 121. Enclosure; 122. Heat dissipation module; 122*a*. Through hole; 122*b*. Heat conducting material; 123. Fins; 130. Electrode; 140. Substrate; 150. Liquid metal; 160. Accommodating cavity; 170. Colloid;

200. Host; 300. Display;

2000. Filling device.

DETAILED DESCRIPTION OF ILLUSTRATIVE EMBODIMENTS

The following describes technical solutions in this application with reference to accompanying drawings. Apparently, the described embodiments are merely some rather than all of the embodiments of this application.

In the description of this application, it should be noted that, unless otherwise specified and limited, the terms “install”, “connection”, and “connect” should be understood in a broad sense, for example, may be a fastened connection, may be a detachable connection, or may be integrally connected; may be a mechanical connection, may be an electrical connection, or may be communication with each other; may be directly connected, or may be indirectly connected by using an intermediate medium, or may be connected inside two components or an interaction relationship between the two components. A person of ordinary skill in the art can understand specific meanings of these terms in this application based on specific situations.

In the description of this application, it should be understood that an orientation or location relationship indicated by the terms "upper", "lower", "side", "inner", "outer", "top", "bottom" is an installation-based orientation or location relationship, which is merely intended to facilitate description and simplify description of this application, and is not intended to indicate or imply that the referred apparatus or component must have a specific orientation, and be constructed and operated in a specific orientation. Therefore, it cannot be understood as a limitation on this application.

It should be further noted that identical or similar parts in embodiments of this application are represented by the same reference sign; and for a plurality of identical parts, it is possible that only one of the parts or components is marked with a reference sign as an example, and it should be understood that for other identical parts, the reference sign is also applicable.

In the description of this application, it should be noted that term "and/or" is only used to describe an association relationship between associated objects, and indicates that three relationships may exist. For example, A and/or B may indicate the following: Only A exists, both A and B exist, and only B exists.

An electronic element is a basic element in an electronic circuit, with two or more leads or metal contacts. After being connected to each other, electronic elements may form an electronic circuit with a specific function. The electronic elements are usually installed on a substrate, and the substrate has functions of carrying, installing, and connecting electronic elements. The electronic element may be an individual package, such as a resistor, a capacitor, an inductor, a transistor, and a diode, or a group with different complexity, such as an integrated circuit (Integrated Circuit, IC) and a chip.

An electronic device includes various electronic elements such as an integrated circuit, a transistor, and an electron tube, and is a device that uses electronic technology software to function, such as a desktop computer, a notebook computer, a tablet computer, a game console, a mobile phone, an electronic watch, a router, a set-top box, a television, and a modem.

With the progress of science and technology, people's requirements for electronic devices are becoming increasingly high, such as high performance, high reliability, and ultra-thinness, which makes an integration level of electronic elements in an electronic device increasingly high, and as power consumption increases, the electronic elements generate a lot of heat during operation. To make the electronic device operate normally, it is required to dissipate heat from the electronic elements.

Thermal resistance refers to a ratio of a temperature difference between two ends of an object and power of a heat source when heat is transferred on the object. Resistance encountered by heat on a heat flow path, reflects a heat transfer capacity of a medium or between media, and indicates a temperature rise caused by 1 W of heat, with a unit of ° C./W or K/W. The temperature rise on the heat transfer path can be obtained by multiplying thermal power consumption by the thermal resistance. A simple analogy can be used to explain the meaning of thermal resistance. A heat exchange amount is equivalent to a current, and a temperature difference is equivalent to a voltage, so that the thermal resistance is equivalent to resistance.

In a related technology, electronic elements may be cooled by a heat dissipation module such as a heat dissipation plate and a cooling fan. Because the electronic elements should not be squeezed by an external force to avoid damage to the electronic elements, the electronic elements are not tightly press-fitted with the heat dissipation module to prevent the heat dissipation module from squeezing the electronic elements. Therefore, good contact seems to be achieved between contact surfaces of the electronic element and the heat dissipation module, but in fact, direct contact is achieved only in a part of the area, and the rest are gaps. A gas in the gaps has high thermal resistance and extremely weak thermal conductivity, which hinders conduction of heat to the heat dissipation module. To improve heat conduction efficiency, the gaps may be filled with heat conduction media to make the heat conduction smoother and faster.

Liquid metal refers to a metal that is liquid at normal temperature (also referred to as room temperature, which is usually defined as 25° C.). The liquid metal has small thermal resistance and high heat dissipation power. Specifically, the heat dissipation power of the liquid metal is about 40 W·m−1k−1~80 W·m−1k−1, while heat dissipation power of thermally conductive pads and thermally conductive silicone grease widely used currently is about 3 W·m−1k−1~15 W·m−1k−1. It can be learned that the liquid metal has good heat dissipation performance and has heat dissipation efficiency which is about 10 times that of thermally conductive silicone grease. Therefore, many devices having high heat dissipation requirements use the liquid metal to fill the foregoing gaps to conduct heat.

Due to an acting force between liquid molecules, each molecule in a surface layer is subjected to a force directed to the interior of the liquid, so that each molecule has tends to enter the interior of the liquid from the surface of the liquid, and therefore the surface of the liquid tends to shrink. In the absence of an external force, each droplet is always spherical, which causes a surface area thereof to shrink to the minimum. This force that makes the surface of the liquid shrink is referred to as surface tension of the liquid. Surface tension is a manifestation of a molecular force. Greater surface tension indicates higher difficulty in evenly dispersing the liquid.

A surface tension coefficient of water is about 72.75×10×3 N·m−1, that is, 72.75 mN·m−1, and the surface tension coefficient of the liquid metal is about 500×10−3 N·m−1~1100×10−3 N·m−1, that is, 500×mN·m−1~1100 m N·m−1. The surface tension coefficient of the liquid metal is about 14 times that of water. It can be learned that the surface tension of the liquid metal is very high.

FIG. 1 is a schematic diagram of a state of a liquid metal in a heat dissipation cover in a related technology. As shown in FIG. 1, under the action of surface tension, the surface of the liquid metal is usually in an undulating state, and the surface of the liquid metal is not easy to spread evenly, which makes it difficult for the liquid metal to fill the gaps between the electronic elements and the heat dissipation module. As a result, there are still many gaps between the electronic elements and the heat dissipation module, resulting in reduced heat dissipation efficiency.

To resolve the foregoing problems, this application provides a method for manufacturing a heat dissipation structure of an electronic element, a heat dissipation structure, and an electronic device. By energizing electrodes during filling with a liquid metal, when the electrodes are in contact with the liquid metal already used for filling, the current flows through the liquid metal, which can effectively reduce the surface tension of the liquid metal and make the surface of the liquid metal evenly spread, so that the liquid metal can fill gaps between an electronic element and a heat dissipation module, thereby preventing gaps between the electronic element and the heat dissipation module, and increasing heat dissipation efficiency.

A method for manufacturing a heat dissipation structure of an electronic element according to an embodiment of this application is first described below.

Figure 2:
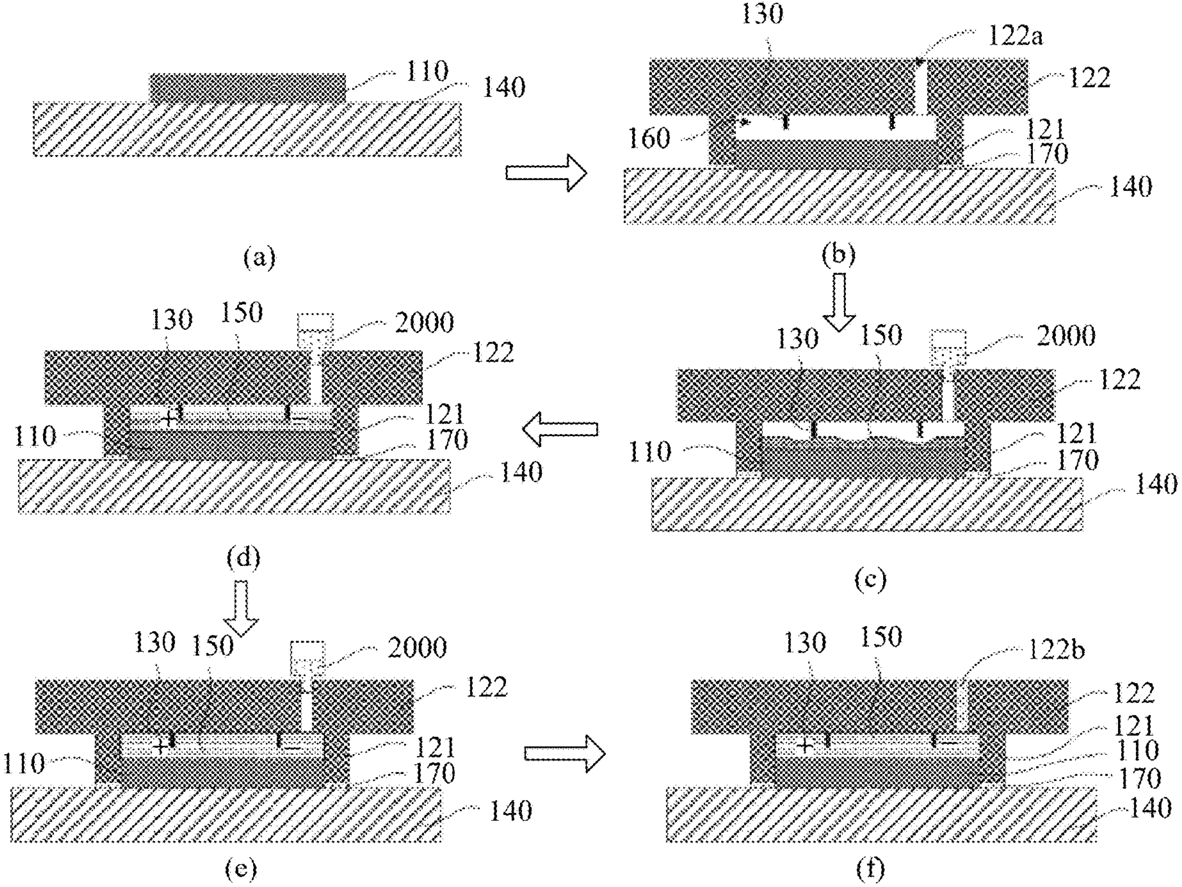
FIG. 2 is a schematic operation flowchart of an example of a method for manufacturing a heat dissipation structure of an electronic element according to an embodiment of this application.
Figure 3:
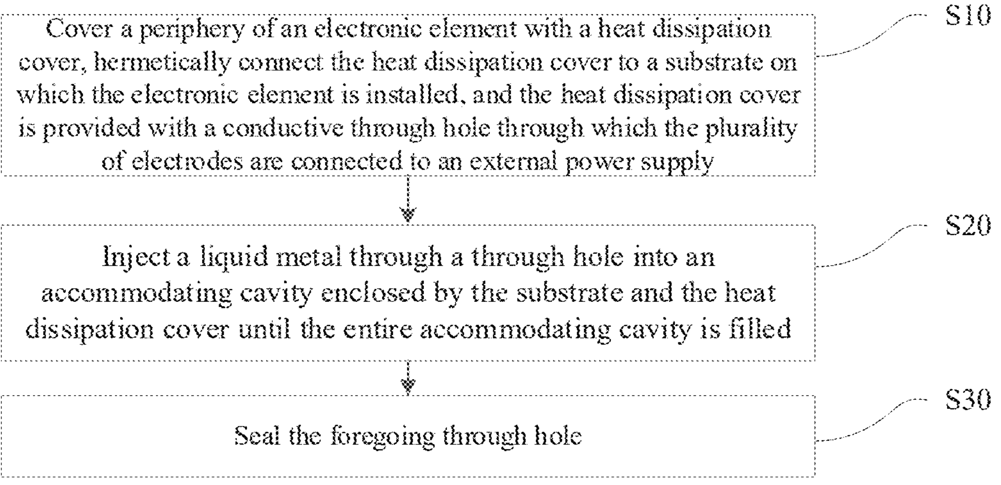
FIG. 3 is a schematic manufacturing flowchart of another example of a method for manufacturing a heat dissipation structure of an electronic element according to an embodiment of this application.

FIG. 2 is a schematic operation flowchart of an example of a method for manufacturing a heat dissipation structure 100 of an electronic element according to an embodiment of this application, and FIG. 3 is a schematic manufacturing flowchart of another example of a method for manufacturing a heat dissipation structure 100 of an electronic element according to an embodiment of this application.

As shown in FIG. 2 and FIG. 3, the method for manufacturing a heat dissipation structure 100 of an electronic element according to this embodiment of this application includes the following steps S10~S30.

Step S10: Cover a periphery of the electronic element 110 with a heat dissipation cover 120, and hermetically connect the heat dissipation cover 120 to a substrate 140 on which the electronic element 110 is installed.

For step S10, refer to operations in (a) and (b) in FIG. 2.

The heat dissipation cover 120 is provided with a through hole 122*a*, and an inner wall of the heat dissipation cover 120 is provided with a plurality of electrodes 130.

The foregoing electronic element 110 may have an individual package structure, such as a resistor, a capacitor, an inductor, a transistor, and a diode. The forgoing electronic element 110 may be a group with different complexity, such as an integrated circuit (Integrated Circuit, IC)

The integrated circuit, which may also be referred to as a microcircuit (microcircuit), a microchip (microchip) or a chip (chip), is used to miniaturize a circuit (mainly including a semiconductor device, and also including a passive component, and the like) and is usually manufactured on a surface of a semiconductor wafer.

In this embodiment of this application, the foregoing electronic element 110 may be a central processing unit (central processing unit, CPU), a graphics processing unit (graphics processing unit, GPU), a radio frequency amplifier, a power amplifier, a power management IC (power management IC, PMIC), a universal flash storage (universal flash storage, UFS), a system in package (System in Package, SiP) element, an antenna in package (antenna in package, AiP), a system on chip (system on chip, SOC) element, a double data rate (double data rate, DDR) memory, a radio frequency integrated circuit (radio frequency integrated circuit, RF IC), an embedded multimedia card (embedded multimedia card, EMMC), and the like, but is not limited thereto.

The substrate 140 is a component for carrying, installing, and connecting the electronic element 110. In this embodiment of this application, the substrate 140 may be a printed circuit board (printed circuit board, PCB), a flexible printed circuit (Flexible Printed Circuit, FPC), a double-sided PCB, a multilayer PCB, and the like, but is not limited thereto.

The electronic element 110 may be welded to the substrate 140 by using a wire or a contact, or through surface-mounting, so as to integrate the electronic element 110 and the substrate 140. A specific mode of connection between the electronic element 110 and the substrate 140 is not limited in this application.

The foregoing heat dissipation cover 120 is configured to dissipate the heat generated by the electronic element 110 to the outside to cool the electronic element 110. After the heat dissipation cover 120 covers the periphery of the electronic element 110, a heat dissipation effect can be achieved, the electronic element 110 can be protected, so that the electronic element 110 is prevented from being damaged due to contact and squeezing with another component, thereby improving reliability of operation of the electronic element 110.

A material of the heat dissipation cover 120 may include at least one of a metal, graphene, silicone grease, silica gel, and plastic, and the material of the heat dissipation cover 120 may also include another material with good heat dissipation performance. This is not specifically limited in this application.

Considering a heat conduction effect and a shielding effect of the heat dissipation cover 120, the heat dissipation cover 120 may be a metal cover, and a material of the metal cover may be stainless steel, a copper-nickel-zinc alloy, a magnesium-aluminum alloy, or the like. This is not limited in this application.

In addition, when being a metal cover, the heat dissipation cover 120 may be picked up and transferred by a magnetic mechanical arm, which facilitates an operation in an assembly process.

The heat dissipation cover 120 may be connected to the substrate 140 in a mode such as surface-mounting, bonding, welding, bolted connection, and buckled connection, so that the heat dissipation cover 120 is fastened to the substrate 140. The heat dissipation cover 120 fastened to the substrate 140 encloses the periphery of the electronic element 110, that is, the electronic element 110 is arranged in an accommodating cavity 160 enclosed by the heat dissipation cover 120 and the substrate 140.

The heat dissipation cover 120 may be hermetically connected to the substrate 140 by using a sealing structure such as a sealing ring, a sealing tape, a sealing strip, and a sealant.

Figure 4:
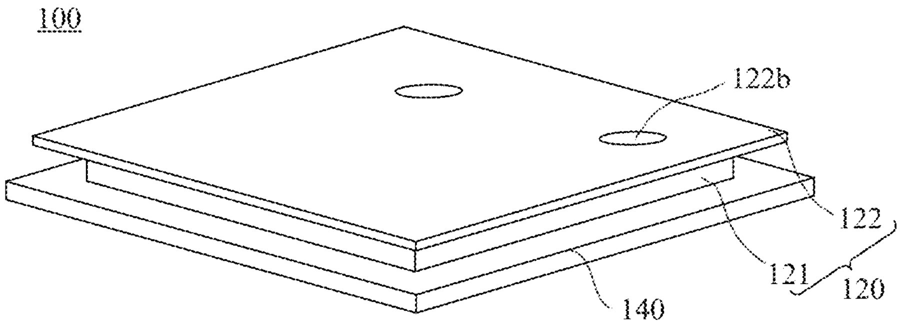
FIG. 4 is a schematic diagram of a structure of an example of a heat dissipation structure of an electronic element according to an embodiment of this application.
Figures 5, 6:
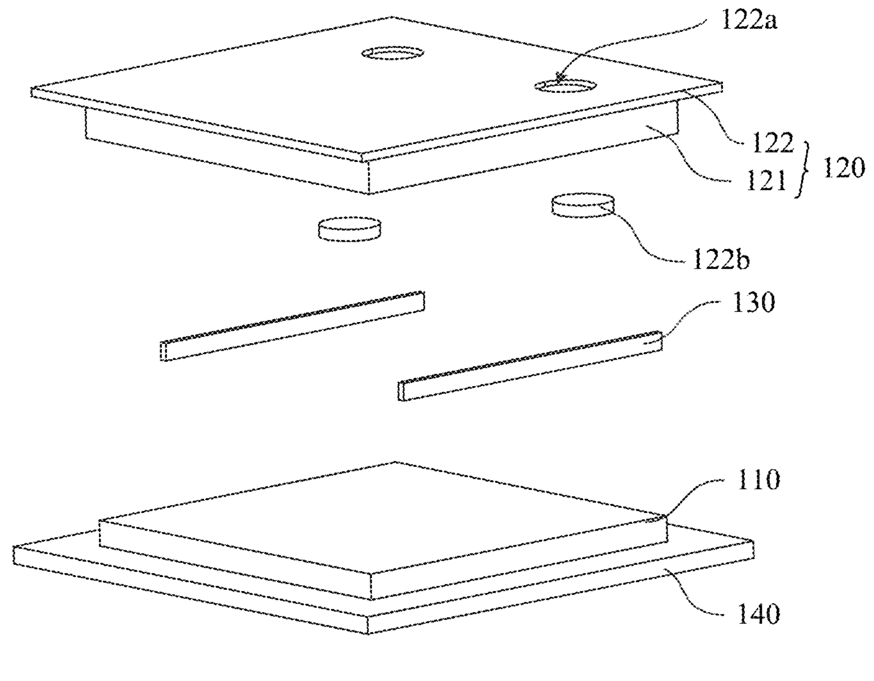
FIG. 5 is an exploded view of the heat dissipation structure of an electronic element shown in FIG. 4.
FIG. 6 is a schematic sectional view of another example of a heat dissipation structure of an electronic element according to an embodiment of this application.

FIG. 4 is a schematic diagram of a structure of an example of a heat dissipation structure 100 of an electronic element according to an embodiment of this application, FIG. 5 is an exploded view of the heat dissipation structure 100 of an electronic element shown in FIG. 4, and FIG. 6 is a schematic sectional view of another example of a heat dissipation structure 100 of an electronic element according to an embodiment of this application.

Optionally, as shown in FIG. 6, the heat dissipation cover 120 may be hermetically bonded to the substrate 140 by using a colloid 170.

The heat dissipation cover 120 may be in a regular shape such as a circular cover, a rectangular cover, and a regular polygonal cover, so as to facilitate machining and manufacturing of the heat dissipation cover 120, and also make the heat dissipation structure 100 of an electronic element simpler in structure. The heat dissipation cover 120 may alternatively have an asymmetric irregular shape.

The structure of the heat dissipation cover 120 may match the structure of the electronic element 110. When the electronic element 110 has a rectangular shape, the heat dissipation cover 120 may also be a rectangular cover; or when the electronic element 110 has a circular shape, the heat dissipation cover 120 may also be a circular cover. In this way, the heat dissipation structure 100 of the electronic element can be more compact and reasonable in structure. The structure of the heat dissipation cover 120 may be different from that of the electronic element 110. For example, the electronic element 110 has a circular shape, and the heat dissipation cover 120 is a rectangular cover. A specific structure of the heat dissipation cover 120 is not limited in this application, provided that the heat dissipation cover 120 can cover the periphery of the electronic element 110.

As shown in FIG. 4 and FIG. 5, an end of the heat dissipation cover 120 is provided with an opening, and the heat dissipation cover covers the periphery of the electronic element 110 through the opening. The through hole 122*a* in the heat dissipation cover 120 may be provided in a top wall of the heat dissipation cover 120 or in a side wall of the heat dissipation cover 120. The top wall of the heat dissipation cover 120 is opposite to the substrate 140, and the side wall of the heat dissipation cover 120 is connected to the substrate 140. The through hole 122*a* may be a hole of any shape, such as a circular hole, a square hole, or an elongated hole.

The heat dissipation cover 120 may be provided with one through hole 122*a* or two or more through holes 122*a*. When the heat dissipation cover 120 is provided with one through hole 122*a*, and a liquid metal 150 is injected into the accommodating cavity 160 through the through hole 122*a*, a gap should be reserved between a device for injecting the liquid metal 150 and a hole wall of the through hole 122*a*, so that a gas in the accommodating cavity 160 can be discharged from the reserved gap. As shown in FIG. 4 and FIG. 5, when two or more through holes 122*a* are provided in the heat dissipation cover 120, one of the through holes 122*a* is used to inject the liquid metal 150, and the remaining through holes 122*a* are used to discharge a gas to the outside.

As shown in FIG. 2, during filling with the liquid metal 150, the substrate 140 is usually placed on a supporting surface such as a desktop for filling. To make the accommodating cavity 160 filled with the liquid metal 150 more easily, a through hole 122*a* may be provided in the top wall of the heat dissipation cover 120, so that the liquid metal 150 flows into the accommodating cavity 160 from top to bottom, making the filling easier.

An electrode 130 is a component in an electronic device 1000, and is used as two terminals for inputting or outputting a current in a conducting medium (solid, gas, vacuum, or liquid). One pole for inputting a current is referred to as an anode, and the anode loses electrons; and the other pole for emitting a current is referred to as a cathode, and the cathode gains electrons.

Two, three, four or more electrodes 130 may be arranged in the heat dissipation cover 120. Structural shapes of the electrodes 130 may be the same or different. For example, a plurality of electrodes 130 may include at least one of a cylindrical electrode 130, a plate electrode 130, an elongated electrode 130, and a point electrode 130, but are not limited thereto. The point electrode 130 may be understood as a spherical electrode 130 with a small diameter, or a columnar electrode 130 with a small diameter and height, or another shape with a small cross-sectional area.

In this embodiment of this application, the electrode 130 is made of a conductive metal material. For example, the material of the electrode 130 may be at least one of copper, iron, silver, tin, and titanium, but is not limited thereto.

The foregoing electrode 130 may be fastened to an inner wall of the heat dissipation cover 120 in a connection mode such as bonding, clamping, threaded connection, and riveting. A wall of the heat dissipation cover 120 may be provided with a conductive through hole, and the electrode 130 is connected to an external power supply through the conductive through hole. Specifically, an end of the electrode 130 for connecting to a power supply may directly run through the conductive through hole of the heat dissipation cover 120 and extend to the outside, or an end of the electrode 130 for connecting to the power supply may be connected to a wire, and the wire runs through the conductive through hole of the heat dissipation cover 120 and extends to the outside, thereby facilitating energization after connection to the power supply.

When the heat dissipation cover 120 is made of a metal material, an insulating material is arranged between the electrode 130 and the heat dissipation cover 120 to insulate the electrode 130 from the heat dissipation cover 120.

A distance between a top surface of the electronic element 110 and the heat dissipation cover 120 may range from 1.2 mm to 1.6 mm, for example, may be 1.2 mm, 1.4 mm, or 1.6 mm, but is not limited thereto. The distance should not be excessively large to reduce an overall volume of the heat dissipation structure 100 of the electronic element, and the distance should not be excessively small to ensure a good heat dissipation effect.

Step S20: Inject a liquid metal 150 through the foregoing through hole 122*a* into an accommodating cavity 160 enclosed by the substrate 140 and the heat dissipation cover 120 until the entire accommodating cavity 160 is filled.

During the operation of step S20, the foregoing electrode 130 is energized, so that the current flows through the liquid metal 150 to reduce the surface tension of the liquid metal 150.

For step S20, refer to (c), (d), and (e) in FIG. 2. (c) in FIG. 2 shows injection of the liquid metal 150 into the accommodating cavity 160, (d) in FIG. 2 shows energization of the electrode 130, and (e) in FIG. 2 shows that the accommodating cavity 160 is filled.

The shape of the foregoing electrode 130 may be any one of a cylindrical shape, a spherical shape, an elongated shape, an annular shape, and a wavy shape. Shapes of a plurality of electrodes 130 may be the same or different. A size of the electrodes 130 may be determined based on a quantity of the electrodes 130, a size of the accommodating cavity 160, and the like. A specific size is not limited. For example, when the electrode 130 is cylindrical, the diameter of the electrode 130 may range from 0.4 mm to 0.8 mm, which is merely described as an example herein and is not used as a specific limitation.

In this embodiment of this application, the electrodes 130 may be used in pairs; and a pair of electrodes 130 includes an anode electrode 130 and a cathode electrode 130, and a current flows from the anode to the cathode. During energization, two electrodes 130 in a pair of electrodes 130 are connected to a positive electrode and a negative electrode of a power supply respectively, so that one of the two electrodes 130 is the anode and the other is the cathode. Potentials of two electrodes 130 in a pair of electrodes 130 are not equal, thereby forming a potential difference between the two electrodes 130.

The two electrodes 130 in a pair of electrodes 130 may have the same shape or different shapes.

In this embodiment of this application, when electrodes 130 are energized, potentials of at least two electrodes 130 are not equal, to form a potential difference between the two electrodes 130, so as to form a current between the two electrodes 130.

When two electrodes 130 are provided in the heat dissipation cover 120, the two electrodes 130 are a pair of electrodes 130. During energization, one electrode 130 may be connected to a positive electrode of a power supply, and the other electrode 130 is connected to a negative electrode of the power supply. Potentials of the two electrodes 130 are different, thereby forming a potential difference between the two electrodes 130, which is a voltage. The electrode 130 connected to the positive electrode of the power supply is the anode, and the electrode 130 connected to the negative electrode of the power supply is the cathode.

Figure 12:
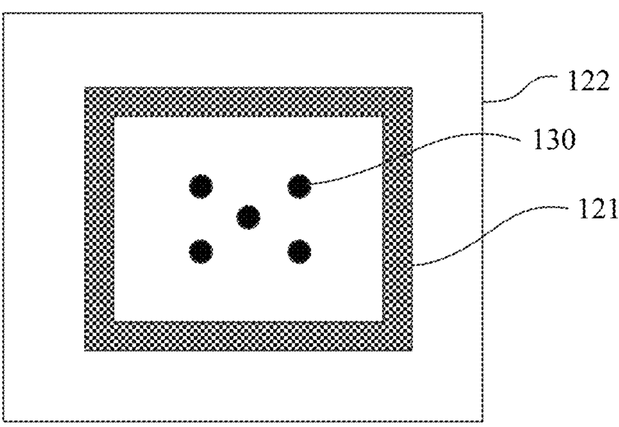
FIG. 12 is a top view of another example of a heat dissipation structure of an electronic element according to an embodiment of this application after removal of a substrate.

FIG. 12 is a top view of another example of a heat dissipation structure 100 of an electronic element according to an embodiment of this application after removal of a substrate 140.

When three or more electrodes 130 are provided in the heat dissipation cover 120, every two adjacent electrodes 130 may be used as a pair of electrodes 130, and no common electrode 130 is provided between each pair of electrodes 130. For example, when four electrodes 130 are provided, the first electrode 130 and the second electrode 130 are a pair of electrodes 130, and the third electrode 130 and the fourth electrode 130 are a pair of electrodes 130, thereby forming two pairs of electrodes 130. Alternatively, a common electrode 130 may be provided between each pair of electrodes 130. For example, when three electrodes 130 are provided, the first electrode 130 (anode) and the second electrode 130 (cathode) are a pair of electrodes 130, and the second electrode 130 (cathode) and the third electrode 130 (anode) are a pair of electrodes 130, thereby forming two pairs of electrodes 130.

For example, as shown in FIG. 12, when five electrodes 130 are provided, a periphery of one of the electrodes 130 is provided with four electrodes 130, and the four electrodes 130 each may form a pair of electrodes 130 with the middle electrode 130, so that a total of four pairs of electrodes 130 can be energized.

In this embodiment of this application, when three or more electrodes 130 are provided, two non-adjacent electrodes 130 may form a pair of electrodes 130. For example, three electrodes 130 are sequentially spaced apart, the first electrode 130 and the third electrode 130 form a pair of electrodes 130, and the second electrode 130 and the third electrode 130 form a pair of electrodes 130. In this case, the current can also flow through the surface of the liquid metal 150 to reduce the surface tension of the liquid metal 150.

During energization, for each pair of electrodes 130, the positive electrode and the negative electrode of the power supply may be connected to the two electrodes 130 in the pair of electrodes 130, so that a potential difference is formed between the two electrodes 130 in the pair of electrodes 130.

Because a distance between two adjacent electrodes 130 is relatively small, a current between two adjacent electrodes 130 is higher, so that the surface tension of the liquid metal 150 can be reduced more easily. Therefore, in the embodiments of this application, every two adjacent electrodes 130 may be energized as a pair of electrodes 130.

In this embodiment of this application, a pattern enclosed by projections of the electrodes 130 on the top wall of the heat dissipation cover 120 may have a large area. Because the current between the electrodes 130 can quickly flow through the liquid metal 150 between the electrodes 130, if the pattern enclosed by the electrodes 130 has a large area, when the electrodes 130 are energized, the current can quickly flow through the surface of the liquid metal 150 in a large area. The current can flow out of the area of the pattern enclosed by the electrodes 130, so that the current can flow through the entire surface of the liquid metal 150, and therefore the surface tension of the liquid metal 150 can be reduced more easily and quickly.

Figure 7:
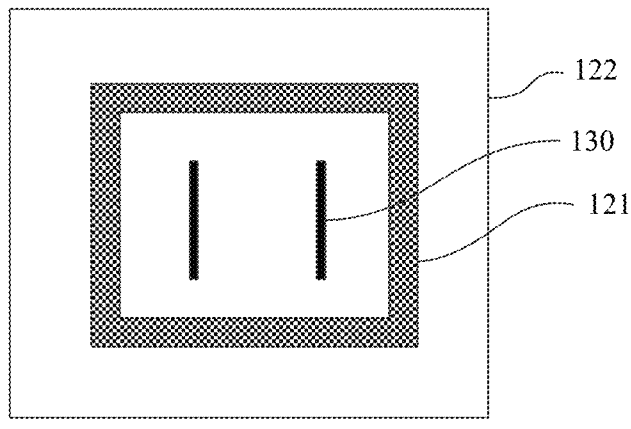
FIG. 7 is a top view of the heat dissipation structure of an electronic element shown in FIG. 6 after removal of a substrate.

FIG. 7 is a top view of the heat dissipation structure 100 of an electronic element shown in FIG. 6 after removal of a substrate 140.

For example, as shown in FIG. 4 and FIG. 7, when two electrodes 130 are provided, the electrodes 130 may be elongated, a length direction of the electrodes 130 is parallel to a width direction of the heat dissipation cover 120, and the two electrodes 130 are spaced apart in a length direction of the heat dissipation cover 120; and a distance between the two electrodes 130 may be ½~⅘ of the length of the heat dissipation cover 120, that is, the distance between the two electrodes 130 is set to be a little larger. The length of the electrode 130 may be ½~⅘ of the width of the heat dissipation cover 120, and the length of the electrode 130 may be set to be a little longer, so that the area of the liquid metal 150 through which the current between the two electrodes 130 flows can be larger. Because a current can be quickly formed in the liquid metal 150 between the two electrodes 130, and the formed current flows out of a coverage of the pattern enclosed by the two electrodes 130, the current can be quickly formed in the entire surface of the liquid metal 150.

The distance between the two electrodes 130 in a pair of electrodes 130 should not be set to be excessively large, so as to prevent a case in which an energy loss of electrons in the liquid metal 150 is too large to form a stable current.

In an implementation, the liquid metal 150 may be injected into the accommodating cavity 160 through the through hole **122*a* by using a filling device 2000** such as a needle tube or an automatic filler.

Optionally, whether the accommodating cavity 160 is filled may be calculated by using a filling amount. Specifically, the volume of the accommodating cavity 160 may be calculated, and the same volume of the liquid metal 150 may be injected into the accommodating cavity 160 to ensure that the liquid metal 150 fills the accommodating cavity 160. Alternatively, whether the accommodating cavity 160 is filled can be observed through the through hole **122*a*. Alternatively, the top wall of the heat dissipation cover 120 may be provided with a transparent visible region, and whether the accommodating cavity 160** is filled can be observed through the visible region.

The material of the foregoing liquid metal 150 may include at least one of bismuth, indium, tin, and gallium, and may also include another metal. The liquid metal 150 may be a gallium-based alloy, an indium-based alloy, or a bismuth-based alloy. Specifically, the gallium-based alloy may be a gallium indium alloy, a gallium lead alloy, a gallium amalgam, a gallium indium tin alloy, or a gallium indium tin zinc alloy; the indium-base alloy may be an indium bismuth copper alloy or an indium bismuth tin alloy; and the bismuth-based alloy may be a bismuth tin alloy. A specific composition of the liquid metal 150 is not limited in this application.

In this embodiment of this application, a principle in which after electrodes 130 are energized, a current flows through the liquid metal 150 to reduce surface tension of the liquid metal 150 is as follows: When the electrodes 130 are energized, the current can be formed in the liquid metal 150, a large quantity of electrons flow inside the liquid metal 150, the moving electrons can provide energy for oxygen in the air to be changed into oxygen ions, so that the oxygen in the air reacts with the liquid metal 150 more easily to form a flowing oxide layer on the surface of the liquid metal 150; and the oxide layer is formed by a metal oxide, which is usually solid powder, and has a very small surface tension coefficient that is about 0.1 mN/m, so that the oxide layer formed on the surface of the liquid metal 150 can greatly reduce the surface tension of the liquid metal 150.

When a voltage applied by two electrodes 130 in a pair of electrodes 130 is higher, the current in the liquid metal 150 is higher, the oxide layer can be formed on the surface of the liquid metal 150 more easily, the formed oxide layer is thicker, and the surface tension of the liquid metal 150 is lower. However, the voltage applied by two electrodes 130 in a pair of electrodes 130 should not be excessively high, so as to prevent a case in which the oxide layer is excessively thick, which destroys fluidity of the liquid metal 150, and reduces heat dissipation performance of the liquid metal 150.

In a specific embodiment, a potential difference between any pair of adjacent electrodes 130 among the plurality of electrodes 130 may be 0.5 V~2 V, for example, the potential difference may be 0.5 V, 1 V, 1.5 V, or 2 V, but is not limited thereto. In this embodiment, a pair of adjacent electrodes 130 means that two electrodes 130 in the pair of electrodes 130 are adjacent, and no other electrodes 130 are provided between the two electrodes 130. One of the two electrodes 130 in the pair of electrodes 130 is a cathode, and the other is an anode.

In this embodiment, the potential difference between a pair of adjacent electrodes 130 is set to a small voltage, so that an oxide layer can be formed on the surface of the liquid metal 150 to reduce the surface tension, and the following case is prevented: The oxide layer is excessively thick, which destroys fluidity of the liquid metal 150 and reduces heat dissipation performance of the liquid metal 150.

In an implementation, step S20 may be implemented by performing the following steps: injecting a liquid metal 150 through the foregoing through hole 122*a* into an accommodating cavity 160 enclosed by the substrate 140 and the heat dissipation cover 120; and when a volume ratio of the liquid metal 150 injected into the accommodating cavity 160 is larger than a preset proportion, energizing the electrodes 130, and continuing to inject until the entire accommodating cavity 160 is filled.

The foregoing volume ratio is a ratio of the volume of the liquid metal 150 to the volume of the accommodating cavity 160. The preset proportion may be any proportion of ⅔~¾, or the preset proportion may be another larger proportion. This is not specifically limited in this application.

In this implementation, the oxide layer is formed on the surface when the accommodating cavity is almost filled with the liquid metal 150, so that the accommodating cavity 160 can be filled with the liquid metal 150, and the thickness of the oxide layer of the liquid metal 150 can be reduced, thereby having little impact on fluidity and heat dissipation of the liquid metal 150.

In another implementation, the electrodes 130 may be energized while the liquid metal 150 is injected, or the electrodes 130 may be energized before the injection. In this embodiment of this application, a specific time for starting the energization is not limited, provided that the electrodes 130 are energized during filling of the accommodating cavity 160.

In this embodiment of this application, the energization may be stopped after the accommodating cavity 160 is filled, to ensure that the accommodating cavity can be filled with the liquid metal 150, and an energization operation is also very convenient. When the liquid metal 150 is injected from the side wall of the heat dissipation cover 120, that is, when the through hole 122*a* is provided in the side wall of the heat dissipation cover 120, the energization may be stopped when the liquid level of the liquid metal 150 is higher than the through hole 122*a*. In this case, the surface tension of the liquid metal 150 that has been injected does not increase because the liquid metal 150 that continues to be injected does not form the surface of the liquid metal 150.

Step S30: Seal the foregoing through hole 122*a*.

For step S30, refer to an operation in (f) in FIG. 2.

Specifically, the foregoing through hole 122*a* may be sealed by using a structure such as a colloid, a sealing cover, a baffle, and a valve.

In a specific embodiment, the foregoing through hole 122*a* may be closed by using a heat conducting material 122*b*. The heat conducting material 122*b* may be silicone grease, silica gel, a metal, and the like, but is not limited thereto. By sealing the through hole 122*a* by using the heat conducting material 122*b*, heat dissipation performance of the heat dissipation cover 120 can be better, so that the heat dissipation performance of the heat dissipation structure is better.

When a plurality of through holes 122*a* are provided, each through hole 122*a* needs to be sealed.

After the foregoing through holes 122*a* are sealed in step S30, the foregoing heat dissipation structure 100 of an electronic element can be obtained.

In the method for manufacturing a heat dissipation structure 100 of an electronic element according to this embodiment of this application, because the inner wall of the heat dissipation cover 120 is provided with a plurality of electrodes 130, in the process of injecting the liquid metal 150 into the accommodating cavity 160 enclosed by the substrate 140 and the heat dissipation cover 120, energizing the electrodes 130 can make the current flow through the liquid metal 150, so that oxygen in the air reacts with the liquid metal 150 more easily to form a flowing oxide layer on the surface of the liquid metal 150. The oxide layer is formed by a metal oxide, which is usually solid powder, and has very small surface tension. Therefore, the oxide layer formed on the surface of the liquid metal 150 can greatly reduce the surface tension of the liquid metal 150, so that the surface of the liquid metal 150 can be evenly spread, and the liquid metal 150 can fill the cavity between the electronic element 110 and the heat dissipation cover 120, thereby preventing gaps between the electronic element 110 and the heat dissipation cover 120 and increasing heat dissipation efficiency.

In addition, the method according to this embodiment of this application can reduce tension of each surface of the liquid metal 150, including a top surface, a bottom surface, and a side surface, so that wettability of the liquid metal 150 on an outer surface of the electronic element 110, an inner surface of the heat dissipation cover 120, and a surface of the substrate 140 can be improved, and the cavity between the electronic element 110 and the heat dissipation cover 120 is further filled, thereby increasing the heat dissipation efficiency.

The heat dissipation cover 120 is connected to the substrate 140, and encloses the outside of the electronic element 110. The heat dissipation cover 120 has a heat dissipation effect, and also has an effect of protecting the electronic element 110, thereby better protecting the electronic element 110.

Figure 8:
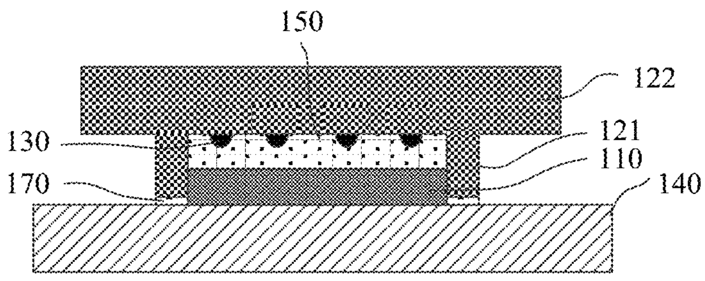
FIG. 8 is a schematic sectional view of another example of a heat dissipation structure of an electronic element according to an embodiment of this application.
Figure 9:
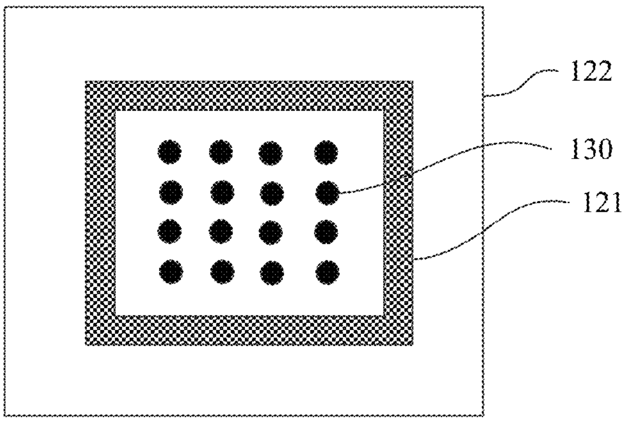
FIG. 9 is a top view of the heat dissipation structure of an electronic element shown in FIG. 8 after removal of a substrate.
Figure 10:
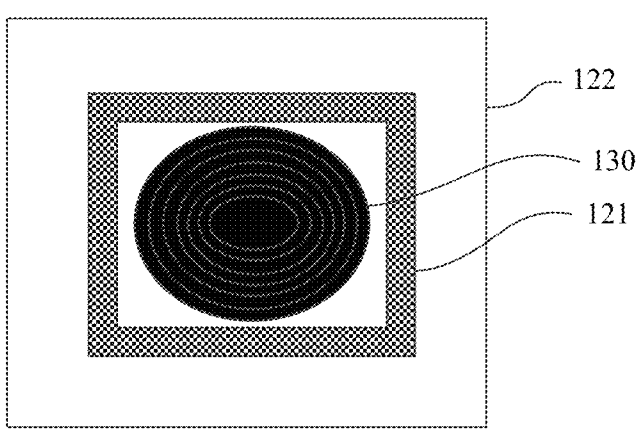
FIG. 10 is a top view of another example of a heat dissipation structure of an electronic element according to an embodiment of this application after removal of a substrate.
Figure 11:
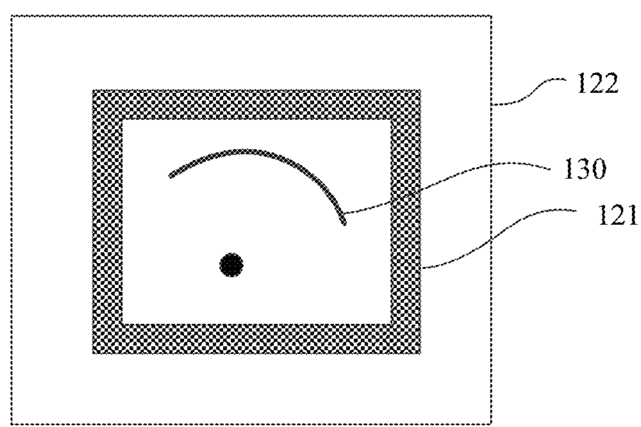
FIG. 11 is a top view of another example of a heat dissipation structure of an electronic element according to an embodiment of this application after removal of a substrate.

FIG. 8 is a schematic sectional view of another example of a heat dissipation structure 100 of an electronic element according to an embodiment of this application. FIG. 9 is a top view of the heat dissipation structure 100 of an electronic element shown in FIG. 8 after removal of a substrate 140. FIG. 10 is a top view of another example of a heat dissipation structure 100 of an electronic element according to an embodiment of this application after removal of a substrate 140. FIG. 11 is a top view of another example of a heat dissipation structure 100 of an electronic element according to an embodiment of this application after removal of a substrate 140.

As shown in FIG. 4 to FIG. 12, an embodiment of this application further provides a heat dissipation structure 100 of an electronic element, including: a substrate 140, a heat dissipation cover 120, and a liquid metal 150.

The substrate 140 is provided with an electronic element 110, and the heat dissipation cover 120 is hermetically connected to the substrate 140. The heat dissipation cover 120 covers a periphery of the electronic element 110, the heat dissipation cover 120 and the substrate 140 form an accommodating cavity 160 for accommodating the electronic element 110, an inner wall of the heat dissipation cover 120 is provided with a plurality of electrodes 130, and the heat dissipation cover 120 is provided with a sealed through hole 122*a*. The liquid metal 150 fills the accommodating cavity 160.

The substrate 140 may be a circular plate, a rectangular plate, or any other plate with a regular shape; or the substrate 140 may be an asymmetric plate with an irregular shape. A specific shape of the substrate 140 is not limited in this application.

The size of the accommodating cavity 160 formed between the heat dissipation cover 120 and the substrate 140 may be determined based on the size of the substrate 140, power consumption of the electronic element 110, and the like. When the substrate 140 has a larger size, there is a larger space on the substrate 140, and the accommodating cavity 160 may be set larger. When the power consumption of the electronic element 110 is higher, the accommodating cavity 160 may be set larger to accommodate more liquid metal 150 for better dissipation of heat from the electronic element 110.

For specific structures, materials, and installation methods of the substrate 140, the heat dissipation cover 120, and the liquid metal 150, refer to the embodiments of the foregoing manufacturing method. Details are not described herein again.

In an implementation, as shown in FIG. 4 and FIG. 5, the heat dissipation cover 120 may include a heat dissipation module 122 and an enclosure 121, and electrodes 130 are arranged on an inner wall of the heat dissipation module 122.

Specifically, the enclosure 121 may have an annular structure, and the enclosure 121 encloses by one round and is fastened to an edge of the heat dissipation module 122, and the enclosure 121 extends to a side of the heat dissipation module 122, so as to form the heat dissipation cover 120 with the heat dissipation module 122.

The enclosure 121 may have a thickness of 2~3 mm, or may have another specific thickness, such as 1 mm or 3 mm. The thickness of the enclosure 121 should not be excessively large to reduce the volume and weight of the enclosure 121, and the thickness of the enclosure 121 should not be excessively small, so that the enclosure 121 has a higher strength and a better heat conduction effect.

The heat dissipation module 122 and the enclosure 121 may be made of a same material or different materials. For example, the heat dissipation module 122 is made of silica gel, and the enclosure 121 is made of a metal, or both the heat dissipation module 122 and the enclosure 121 are made of silica gel. In this embodiment of this application, the enclosure 121 and the heat dissipation module 122 may both be made of a heat conducting material.

The heat dissipation module 122 may be fastened to the enclosure 121 in a connection mode such as bonding, clamping, threaded connection, riveting, and welding. To improve structural reliability of the heat dissipation cover 120, the heat dissipation module 122 and the enclosure 121 can form an integrated structure by using an integrated molding process, thereby making a processing flow simpler.

The heat dissipation module 122 may include a heat dissipation plate, and the heat dissipation plate may be provided with a heat dissipation structure such as a heat dissipation grid and cooling fins 123, so that a larger heat exchange area can be provided, thereby increasing the heat dissipation efficiency of the heat dissipation structure. The heat dissipation module 122 may also be a metal support of a functional element in the electronic device 1000. For example, when the electronic device 1000 is a mobile phone, the heat dissipation module 122 is a metal supporting component of a battery or a screen, which can quickly conduct heat from the inside of the mobile phone to the outside and dissipate the heat to the environment.

The heat dissipation module 122 may be connected to metal supports of some functional elements in the electronic device 1000, such as a metal support of a battery or screen, so as to conduct heat to the metal support, and then the metal support dissipates heat to the environment.

The heat generated by the electronic element 110 is conducted to the heat dissipation module 122 through the liquid metal 150 in the accommodating cavity 160, and then the heat is dissipated to the environment by the heat dissipation module 122.

The inner wall of the heat dissipation module 122 is the inner surface of the heat dissipation module 122 facing the accommodating cavity 160.

During filling with the liquid metal 150, the substrate 140 is usually placed on a manufactured surface such as a desktop for filling, the heat dissipation module 122 is located at the top, and a liquid level of the liquid metal 150 in the accommodating cavity 160 gradually rises from a position close to the substrate 140 to a position close to the heat dissipation module 122. In this embodiment of this application, the electrodes 130 are installed on the inner wall of the heat dissipation module 122, so that when the accommodating cavity is almost filled with the liquid metal 150, the liquid metal 150 comes into contact with the electrodes 130 to form a current, and then an oxide layer is formed on the surface. In this way, the accommodating cavity 160 can be filled with the liquid metal 150, and the thickness of the oxide layer of the liquid metal 150 can be reduced, thereby having little impact on fluidity and heat dissipation of the liquid metal 150.

Figure 14:
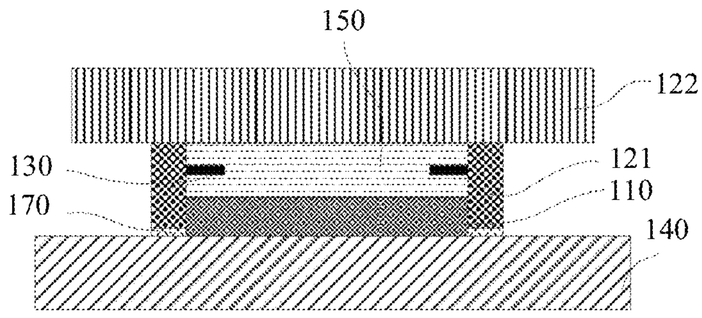
FIG. 14 is a schematic sectional view of another example of a heat dissipation structure of an electronic element according to an embodiment of this application.
Figure 15:
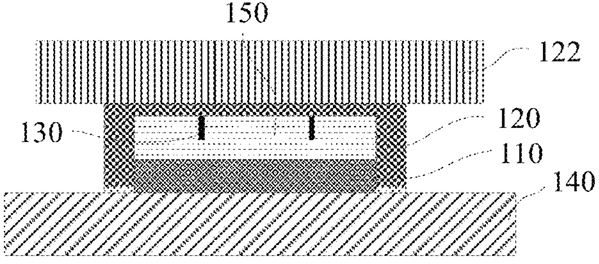
FIG. 15 is a schematic sectional view of another example of a heat dissipation structure of an electronic element according to an embodiment of this application.

FIG. 14 is a schematic sectional view of another example of a heat dissipation structure 100 of an electronic element according to an embodiment of this application. FIG. 15 is a schematic sectional view of another example of a heat dissipation structure 100 of an electronic element according to an embodiment of this application. Optionally, as shown in FIG. 14, electrodes 130 may alternatively be arranged on an enclosure 121.

In another implementation, as shown in FIG. 15, the heat dissipation structure 100 of an electronic element may further include a heat dissipation module 122, a heat dissipation cover 120 and the heat dissipation module 122 have a split structure, and a top wall of the heat dissipation cover 120 is closely attached and fastened to a bottom wall of the heat dissipation module 122 in a mode such as bonding, welding, and bolted connection. In this case, the heat of the electronic element 110 is conducted to the heat dissipation cover 120 through the liquid metal 150, and the heat dissipation cover 120 conducts the heat to the heat dissipation module 122, and then dissipates the heat to the environment through the heat dissipation module 122.

In an implementation, as shown in FIG. 4 and FIG. 5, two through holes 122*a* may be provided, and the two through holes 122*a* are provided in the heat dissipation module 122.

In this implementation, the two through holes 122*a* are used to inject the liquid metal 150 and discharge a gas in the accommodating cavity 160, respectively.

As described above, during filling with the liquid metal 150, the liquid level of the liquid metal 150 in the accommodating cavity 160 gradually rises from the position close to the substrate 140 to the position close to the heat dissipation module 122. In this implementation, the through holes 122*a* are provided in the heat dissipation module 122, that is, the through holes 122*a* are provided in the top wall of the heat dissipation cover 120. In this way, as described above in the method embodiment, when the through holes 122*a* are used to inject the liquid metal 150, the liquid metal 150 can flow into the accommodating cavity 160 from top to bottom, so that the accommodating cavity 160 can be filled with the liquid metal 150 more easily. When the through holes 122*a* are used for exhaust, because the through holes 122*a* are located at the top of the accommodating cavity 160, all the gas in the accommodating cavity 160 can be exhausted through the through holes 122*a*, so that the liquid metal 150 can be more smoothly injected into the accommodating cavity 160.

In an implementation, as shown in FIG. 11, the plurality of electrodes 130 may include at least one point electrode 130 and at least one strip electrode 130.

Specifically, the plurality of electrodes 130 may include one point electrode 130 and one strip electrode 130, or may include one point electrode 130 and a plurality of strip electrodes 130, where each strip electrode 130 forms a pair of electrodes 130 with one point electrode 130 during energization; or the plurality of electrodes include a plurality of point electrodes 130 and a plurality of strip electrodes 130, where each point electrode 130 and each strip electrode 130 adjacent to each other form a pair of electrodes 130 during energization.

The shape of the strip electrode 130 may be a linear shape, an arc shape, a wave shape, or the like, but is not limited thereto.

During energization, a point electrode 130 and a strip electrode 130 may be used as a pair of electrodes 130, and are an anode and a cathode respectively. Specifically, the point electrode 130 may be the cathode, while the strip electrode 130 is the anode, or the point electrode 130 may be the anode, while the strip electrode 130 is the cathode. In this way, a divergent current may be formed between the point electrode 130 and the strip electrode 130, and the current has a wide coverage, so that the current can be quickly formed in a large area on the surface of the liquid metal 150 The current can flow to all positions of the surface of the liquid metal 150, so that the current can flow through the entire surface of the liquid metal 150, and the surface tension of the liquid metal 150 can be reduced more easily and quickly.

In another implementation, as shown in FIG. 9, a plurality of electrodes 130 may be arranged on the inner wall of the heat dissipation module 122 in an array.

In this implementation, three or more electrodes 130 may be provided. A plurality of electrodes 130 may be arranged on the inner wall of the heat dissipation module 122 in the form of a linear array, a circular array, a rectangular array, or the like.

For example, when a plurality of electrodes 130 are distributed in a rectangular array as shown in FIG. 9, all rows of electrodes 130 may be alternately used as anodes and cathodes. For example, the first row and the third row are anodes, and the second row and the fourth row are cathodes. The electrodes may alternatively be energized in another mode, which is not limited herein.

Optionally, the plurality of electrodes 130 may all be point electrodes 130, and the electrodes 130 are distributed in a circular array or a rectangular array.

In this implementation, an array distribution mode of the electrodes 130 may be determined based on the shape of the inner wall of the heat dissipation module 122. For example, when the inner wall of the heat dissipation module 122 is circular, the electrodes 130 are distributed in a circular array; or when the inner wall of the heat dissipation module 122 is rectangular, the electrodes 130 are distributed in a rectangular array. In this way, when the electrodes 130 are energized, the current flows through the entire surface of the liquid metal 150 more quickly, so that the surface tension of the liquid metal 150 can be reduced more easily and quickly.

In addition, a plurality of electrodes 130 distributed in an array can further increase a surface area of the heat dissipation module 122, a contact area between the heat dissipation module 122 and the liquid metal 150, and a contact area for heat exchange with air, thereby increasing heat dissipation efficiency.

In another implementation, as shown in FIG. 10, the plurality of electrodes 130 all have annular structures with different sizes, and the plurality of annular structures are sequentially nested.

In this implementation, diameters of the plurality of electrodes 130 sequentially become larger, so that the electrodes are sequentially nested. During energization, every two adjacent electrodes 130 may form a pair of electrodes 130.

In this implementation, because every two adjacent rings among sequentially nested rings can be energized to form a pair of electrodes 130, and the rings each have a closed structure, the surface of the liquid metal 150 can form a current more quickly and evenly, and the surface tension of the liquid metal 150 can be reduced more easily and quickly.

In an implementation, a gap may be reserved between a side wall of the electronic element 110 and an inner wall of the enclosure 121, and the gap is filled with a liquid metal 150. In this way, a side surface of the electronic element 110 can also dissipate heat. The gap may range from 0.5 mm to 1.0 mm, and is, for example, 0.5 mm, 0.8 mm, or 1 mm, but is not limited thereto.

In a possible design, a plurality of electronic elements 110 are arranged on the substrate 140, and the heat dissipation cover 120 encloses the exterior of the plurality of electronic elements 110. That a single heat dissipation cover 120 corresponds to a plurality of electronic elements 110 can reduce production processes and installation process costs of the heat dissipation cover 120, and then reduce manufacturing costs of the heat dissipation structure in this application.

Figure 13:
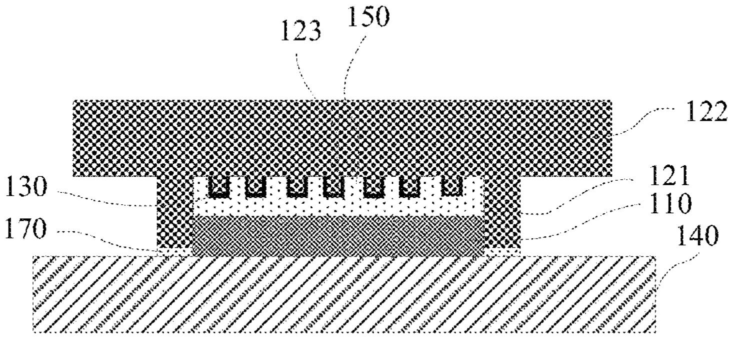
FIG. 13 is a schematic sectional view of another example of a heat dissipation structure of an electronic element according to an embodiment of this application.

As shown in FIG. 13, in an embodiment, the heat dissipation module 122 is provided with a plurality of cooling fins 123, and outer surfaces of the cooling fins 123 are coated with a metal coating, which is the foregoing electrode 130.

In this embodiment, the cooling fins 123 on the heat dissipation module 122 can increase a contact area for heat exchange with the air, thereby increasing heat dissipation efficiency.

As for the embodiment of the heat dissipation structure 100 of an electronic element, since a part of the heat dissipation structure has been described in detail in the foregoing embodiment of the manufacturing method, only the features not described in the embodiment of the manufacturing method are described herein, and the same content is not described in detail herein again.

The heat dissipation structure 100 of an electronic element according to this embodiment of this application is manufactured by using the foregoing manufacturing method, and therefore has the same beneficial effects as the heat dissipation structure 100 of an electronic element manufactured by using the foregoing manufacturing method. Details are not described herein again.

Figure 16:
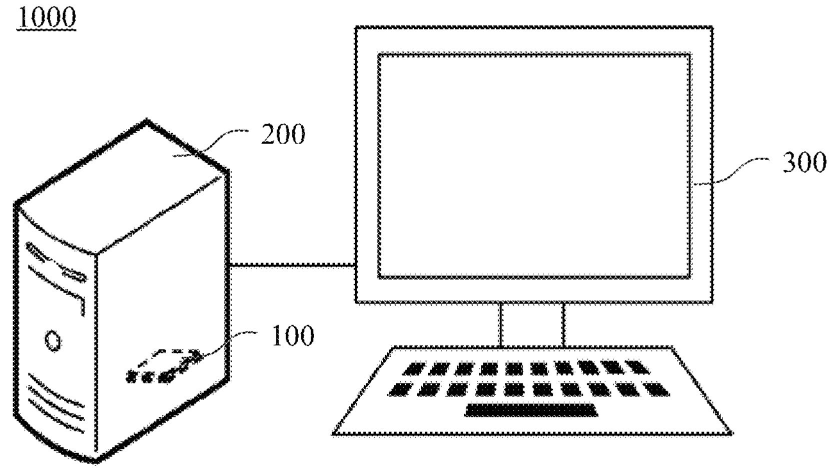
FIG. 16 is a schematic diagram of a structure of an electronic device according to an embodiment of this application.

This application further provides an electronic device 1000. FIG. 16 is a schematic diagram of a structure of an electronic device 1000 according to an embodiment of this application.

As shown in FIG. 16, the electronic device 1000 may be a desktop computer. The desktop computer includes a host 200 and a display 300, and the host 200 is internally provided with a heat dissipation structure 100 of an electronic element.

Alternatively, the electronic device 1000 may be any one of a notebook computer, a tablet computer, a game console, a mobile phone, an electronic watch, a router, a set-top box, a television, and a modem, but is not limited thereto.

Optionally, in the electronic device 1000 according to this embodiment of this application, in addition to application of the foregoing heat dissipation structure 100 of an electronic element, a position relationship of the heat dissipation structure 100 of an electronic element in the electronic device 1000 can be further reasonably arranged, so as to further improve the heat dissipation effect of the electronic device 1000 and heat conduction efficiency of the heat dissipation structure 100 of an electronic element. A specific layout design is as follows:

I. It is best to place temperature-sensitive electronic elements 110 in a region with the lowest temperature, such as the bottom of the electronic device 1000, and the electronic element 110 should not be installed directly above a heat-generating device. It is best to arrange a plurality of devices in a staggered mode on a horizontal plane.

II. The heat dissipation of the heat dissipation structure mainly depends on the air flow, so it is required to study an air flow path and reasonably configure devices such as a fan in design.

III. Concentration of hot spots on the substrate 140 should be prevented, electronic elements 110 with high power should be evenly distributed on the substrate 140 if possible, and surface temperature performance of the substrate 140 should be kept uniform and consistent.

IV. Electronic elements 110 with the highest power consumption and a maximum heat generation amount are arranged near an optimal heat dissipation position in the electronic device 1000, for example, near an air outlet position of a fan.

V. Electronic elements 110 on the same substrate 140 should be arranged based on heat generation amounts and heat dissipation degrees thereof if possible. Electronic elements 110 with small heat generation amounts or poor heat resistance are placed most upstream of an cooling airflow, and devices with large heat generation amounts or good heat resistance (such as a large-scale integrated circuit) are placed at most downstream of the cooling airflow.

VI. In a horizontal direction, high-power electronic elements 110 are arranged as close as possible to an edge of the substrate 140 to shorten a heat transfer path; and in a vertical direction, the high-power electronic elements 110 are arranged as close as possible to the top of the substrate 140 to reduce the impact of these devices on the temperature of other devices during operation.

The electronic device 1000 according to this embodiment of this application includes the foregoing heat dissipation structure 100 of an electronic element, and therefore has the same beneficial effects as the foregoing heat dissipation structure 100 of an electronic element. Details are not described herein again.

The foregoing descriptions are merely specific implementations of this application, but the protection scope of this application is not limited thereto. Any person skilled in the art can easily conceive changes or replacements within the technical scope disclosed in this application, and these changes or replacements shall fall within the protection scope of this application. Therefore, the protection scope of this application shall be subject to the protection scope of the claims.

What is claimed is:

1. A method, comprising:

covering a periphery of an electronic element with a heat dissipation cover, and using a colloid to hermetically connect the heat dissipation cover to a substrate on which the electronic element is installed, wherein:

the heat dissipation cover comprises a heat dissipation module and an enclosure, a plurality of electrodes is installed on an inner wall of the heat dissipation module facing the electronic element and the substrate, two through holes are provided in the heat dissipation module on the inner wall on which the plurality of electrodes is installed, the heat dissipation module extends laterally beyond the enclosure in a direction parallel to the inner wall of the heat dissipation module, the colloid is between the substrate and the enclosure and contacts the substrate, the enclosure, and the electronic element, and the colloid overlaps a top surface of the enclosure in a direction perpendicular to the inner wall of the heat dissipation module facing the electronic element and the substrate;

injecting a liquid metal through a through hole of the two through holes into an accommodating cavity enclosed by the substrate and the heat dissipation cover until an entirety of the accommodating cavity is filled, and during a period of the injecting, energizing the plurality of electrodes, so that a current flows through the liquid metal to reduce surface tension of the liquid metal; and sealing the two through holes.

2. The method according to claim 1, wherein a potential difference between any pair of adjacent electrodes among the plurality of electrodes ranges from 0.5 V to 2 V.

3. The method according to claim 1, wherein the plurality of electrodes comprise at least one point electrode and at least one strip electrode.

4. The method according to claim 1, wherein the plurality of electrodes are arranged on the inner wall of the heat dissipation module in an array mode.

5. The method according to claim 1, wherein the plurality of electrodes all have annular structures with different sizes, and the annular structures are sequentially nested.

6. The method according to claim 1, wherein the sealing the through hole comprises:

sealing the through hole by using a heat conducting material.

7. The method according to claim 1, wherein the plurality of electrodes are in direct electrical contact with the liquid metal, and the current flowing through the liquid metal causes oxygen to react with the liquid metal to form an oxide layer on a surface of the liquid metal, thereby reducing the surface tension of the liquid metal.

8. A heat dissipation structure of an electronic element, comprising:

a substrate provided with the electronic element;

a heat dissipation cover hermetically connected to the substrate via a colloid and covering a periphery of the electronic element, wherein:

the heat dissipation cover and the substrate form an accommodating cavity for accommodating the electronic element, the heat dissipation cover comprises a heat dissipation module and an enclosure, a plurality of electrodes is installed on an inner wall of the heat dissipation module facing the electronic element and the substrate, two sealed through holes are provided in the heat dissipation module on the inner wall on which the plurality of electrodes is installed, the heat dissipation module extends laterally beyond the enclosure in a direction parallel to the inner wall of the heat dissipation module, the colloid is between the substrate and the enclosure and contacts the substrate, the enclosure, and the electronic element, and the colloid overlaps a top surface of the enclosure in a direction perpendicular to the inner wall of the heat dissipation module facing the electronic element and the substrate; and a liquid metal filling the accommodating cavity.

9. The heat dissipation structure according to claim 8, wherein the plurality of electrodes comprise at least one point electrode and at least one strip electrode.

10. The heat dissipation structure according to claim 8, wherein the plurality of electrodes are arranged on the inner wall of the heat dissipation module in an array mode.

11. The heat dissipation structure according to claim 9, wherein the plurality of electrodes all have annular structures with different sizes, and the annular structures are sequentially nested.

12. The heat dissipation structure according to claim 8, wherein a material for sealing the sealed through hole is a heat conducting material.

13. An electronic device, comprising:

a heat dissipation structure, the heat dissipation structure including:

a substrate provided with an electronic element;

a heat dissipation cover hermetically connected to the substrate via a colloid and covering a periphery of the electronic element, wherein:

the heat dissipation cover and the substrate form an accommodating cavity for accommodating the electronic element, the heat dissipation cover comprises a heat dissipation module and an enclosure, a plurality of electrodes is installed on an inner wall of the heat dissipation module facing the electronic element and the substrate, two sealed through holes are provided in the heat dissipation module on the inner wall on which the plurality of electrodes is installed, the heat dissipation module extends laterally beyond the enclosure in a direction parallel to the inner wall of the heat dissipation module, the colloid is between the substrate and the enclosure and contacts the substrate, the enclosure, and the electronic element, and the colloid overlaps a top surface of the enclosure in a direction perpendicular to the inner wall of the heat dissipation module facing the electronic element and the substrate; and a liquid metal filling the accommodating cavity.

14. The electronic device according to claim 13, wherein the plurality of electrodes comprise at least one point electrode and at least one strip electrode.

15. The electronic device according to claim 13, wherein the plurality of electrodes are arranged on the inner wall of the heat dissipation module in an array mode.

* * * * *